(12) United States Patent
Li et al.

(10) Patent No.: US 12,034,088 B2
(45) Date of Patent: Jul. 9, 2024

(54) OPTICAL MODULE, MANUFACTURING METHOD, AND DISPLAY DEVICE

(71) Applicant: BOE Technology Group Co., Ltd., Beijing (CN)

(72) Inventors: Duohui Li, Beijing (CN); Kang Guo, Beijing (CN); Mengya Song, Beijing (CN); Haitao Huang, Beijing (CN); Renquan Gu, Beijing (CN); Feng Zhang, Beijing (CN); Meili Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 249 days.

(21) Appl. No.: 17/635,794

(22) PCT Filed: Apr. 26, 2021

(86) PCT No.: PCT/CN2021/089948
§ 371 (c)(1),
(2) Date: Feb. 16, 2022

(87) PCT Pub. No.: WO2022/226725
PCT Pub. Date: Nov. 3, 2022

(65) Prior Publication Data
US 2023/0343880 A1    Oct. 26, 2023

(51) Int. Cl.
*H01L 31/0216* (2014.01)
*G02F 1/1335* (2006.01)
*H01L 31/0232* (2014.01)

(52) U.S. Cl.
CPC .. *H01L 31/02164* (2013.01); *G02F 1/133509* (2013.01); *G02F 1/133512* (2013.01); *G02F 1/133526* (2013.01); *H01L 31/02327* (2013.01)

(58) Field of Classification Search
CPC ........ H01L 31/02164; H01L 31/02327; G02F 1/133509; G02F 1/133512; G02F 1/133526
See application file for complete search history.

(56) References Cited

U.S. PATENT DOCUMENTS

2015/0268478 A1   9/2015   Kim
2021/0132261 A1   5/2021   Wang et al.

FOREIGN PATENT DOCUMENTS

| CN | 1808190 B | * | 4/2010 | ............. G02B 5/201 |
| CN | 101517439 B | * | 7/2011 | ............. G02B 5/201 |
| CN | 102289016 A |   | 12/2011 | |
| CN | 102293053 B | * | 4/2015 | ......... H01L 51/5275 |
| CN | 104678641 A |   | 6/2015 | |
| CN | 110764169 A |   | 2/2020 | |

(Continued)

*Primary Examiner* — Matthew E Warren
(74) *Attorney, Agent, or Firm* — IPro, PLLC

(57) ABSTRACT

The present disclosure belongs to the field of display technology, and provides an optical module, a manufacturing method thereof, and a display device. The optical module includes: a substrate; a barrier structure arranged on the substrate; a black matrix arranged within the barrier structure, an orthogonal projection of the black matrix onto the substrate not going beyond a region surrounded by the barrier structure; and optical lenses arranged on a side of the black matrix away from the substrate. An orthogonal projection of a gap between adjacent optical lenses onto the substrate falls into the black matrix.

15 Claims, 5 Drawing Sheets

(56) References Cited

FOREIGN PATENT DOCUMENTS

| CN | 111725418 A | | 9/2020 | |
|---|---|---|---|---|
| CN | 112904609 A | * | 6/2021 | |
| KR | 20130008660 A | * | 1/2013 | ........... G02B 3/0056 |
| WO | WO-2011121668 A1 | * | 10/2011 | ......... H01L 51/5275 |

* cited by examiner

OPTICAL MODULE, MANUFACTURING METHOD, AND DISPLAY DEVICE

CROSS-REFERENCE TO RELATED APPLICATION

This application is the U.S. national phase of PCT application No. PCT/CN2021/089948 filed on Apr. 26, 2021, which is incorporated herein by reference in its entirety.

TECHNICAL FIELD

The present disclosure relates to the field of display technology, in particular to an optical module, a manufacturing method thereof, and a display device.

BACKGROUND

Along with the development of the display technology, the miniaturization of optical elements is increasingly demanded, and an optical lens has emerged. The optical lens generally refers to a lens having an aperture size at a micrometer scale to a millimeter scale, and a quantity of optical lenses are arranged according to a specific rule. As compared with a traditional lens, the optical lens and an array thereof have such advantages as small volume, light weight, and low power consumption. The optical lens is capable of realizing optical characteristics which a traditional optical device does not have, and the device is provided with various special functions based on these optical characteristics. For example, in the field of display, glassless three-dimensional (3D) display is realized through the optical lens.

SUMMARY

In one aspect, the present disclosure provides in some embodiments an optical module, including: a substrate; a barrier structure arranged on the substrate; a black matrix arranged within the barrier structure, an orthogonal projection of the black matrix onto the substrate not going beyond a region surrounded by the barrier structure: and optical lenses arranged on a side of the black matrix away from the substrate. An orthogonal projection of a gap between adjacent optical lenses onto the substrate falls into the black matrix.

In a possible embodiment of the present disclosure, the barrier structure is a bank arranged on the substrate and surrounding the black matrix.

In a possible embodiment of the present disclosure, a thickness of the bank is greater than or equal to a thickness of the black matrix.

In a possible embodiment of the present disclosure, the barrier structure is a groove penetrating through a part of the substrate, and the black matrix is located within the groove.

In a possible embodiment of the present disclosure, the optical module further includes a transparent material layer arranged on a surface of the substrate, and the barrier structure is a groove penetrating through at least a part of the transparent material layer.

In a possible embodiment of the present disclosure, a thickness of the black matrix is less than or equal to a depth of the groove.

In another aspect, the present disclosure provides in some embodiments a display device including the above-mentioned optical module.

In a possible embodiment of the present disclosure, the display device further includes a display panel arranged opposite to the optical module to form a cell, sub-pixels of the display panel correspond to the optical lenses respectively, and an orthogonal projection of a center point of each sub-pixel onto the substrate coincides with an orthogonal projection of a center point of a corresponding optical lens onto the substrate.

In a possible embodiment of the present disclosure, the optical lenses are arranged on a side of the substrate away from the display panel.

In a possible embodiment of the present disclosure, the optical lenses are arranged on a side of the substrate facing the display panel, a layer having a low refractive index is filled between the substrate and the display panel, a thickness of the layer is greater than a thickness of the optical lens, and the refractive index of the layer is less than a refractive index of the optical lens.

In yet another aspect, the present disclosure provides in some embodiments a method for manufacturing an optical module, including: providing a substrate; forming a barrier structure on the substrate; forming a black matrix within the barrier structure, an orthogonal projection of the black matrix onto the substrate not going beyond a region surrounded by the barrier structure; and forming optical lenses through heat reflux. An orthogonal projection of a gap between adjacent optical lenses onto the substrate falls within the black matrix.

In a possible embodiment of the present disclosure, the forming the barrier structure includes: forming a transparent material layer on the substrate; and forming a bank using the transparent material layer through imprinting or photoetching to surround the black matrix.

In a possible embodiment of the present disclosure, the barrier structure is a groove penetrating through a part of the substrate, and the forming the barrier structure includes etching a surface of the substrate to form the groove penetrating through a part of the substrate.

In a possible embodiment of the present disclosure, the forming the barrier structure includes: forming a transparent material layer on the substrate; and etching the transparent material layer to form a groove penetrating through at least a part of the transparent material layer as the barrier structure.

Figure 1:
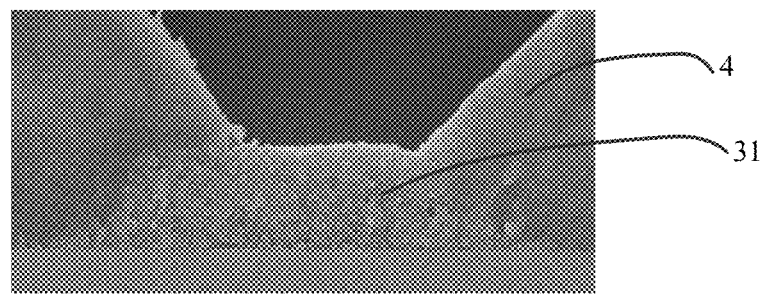
FIG. 1 is a schematic view showing a situation where an edge portion of a black matrix is melted.

REFERENCE SIGN LIST 1 substrate
2, 6 transparent material layer
21 bank
3 black matrix material layer
31 black matrix
4 optical lens
5, 7 groove 8 layer having low refractive index
9 display panel
10 film layer
11, 13, 15 location point
12, 14, 16 light

DETAILED DESCRIPTION

In order to make the objects, the technical solutions and the advantages of the present disclosure more apparent, the present disclosure will be described hereinafter in a clear and complete manner in conjunction with the drawings and embodiments.

In the related art, optical lenses are formed through heat reflux. To be specific, a photoresist array is formed on a substrate and then heated through heat reflux so as to form a spherical optical lens under the effect of surface tension. However, when the optical lens is formed through heat reflux, a high temperature needs to be provided. As shown in FIG. 1, an edge portion of a black matrix 31 formed previously is melted due to the high temperature, and a melted black matrix material flows to a region where the optical lens 4 is located, so parts of the optical lenses 4 are shielded, and thereby a light transmittance of an arrange of optical lenses is adversely affected.

An object of the present disclosure is to provide an optical module, a manufacturing method thereof and a display device, so as to ensure the light transmittance of the optical module.

The present disclosure provides in some embodiments an optical module, which includes: a substrate; a barrier structure arranged on the substrate: a black matrix arranged within the barrier structure, an orthogonal projection of the black matrix onto the substrate not going beyond a region surrounded by the barrier structure; and optical lenses arranged on a side of the black matrix away from the substrate. An orthogonal projection of a gap between adjacent optical lenses onto the substrate falls into the black matrix.

In the embodiments of the present disclosure, the barrier structure is arranged on the substrate, and the black matrix is located within the region defined by the barrier structure. In this regard, even if an edge portion of the black matrix is melted at a high temperature when the optical lenses are formed through heat reflux, the barrier structure may block the flow of a melted black matrix material, so as to prevent the black matrix material from flowing to a region where the optical lenses are located, thereby to prevent a light transmittance of the optical module from being deteriorated.

Figure 2:
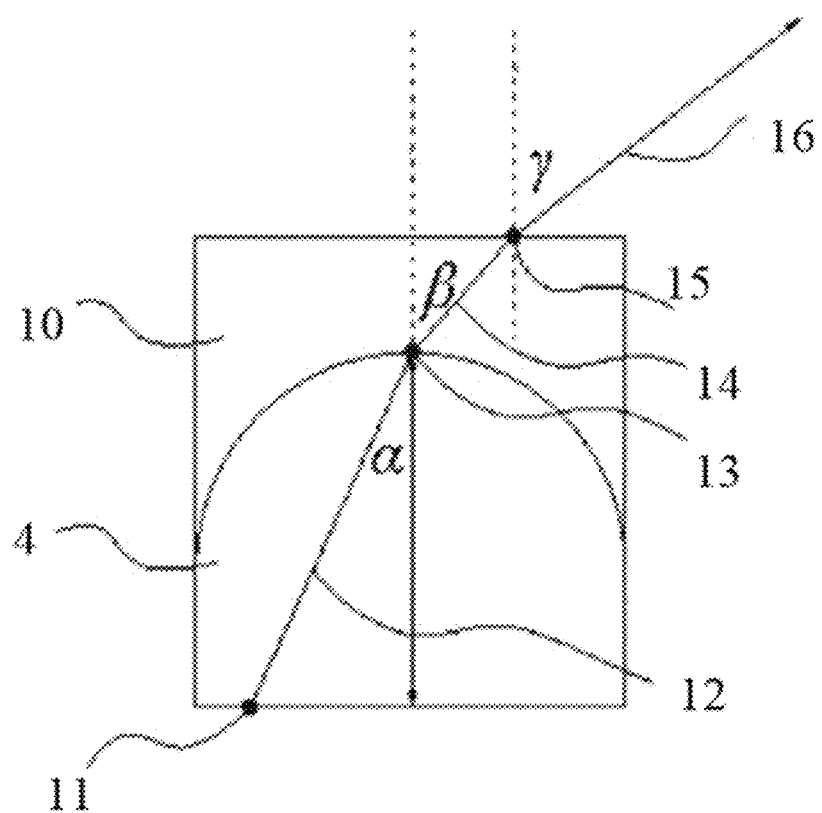
FIGS. 2 and 3 are schematic views showing glassless 3D display.

In the embodiments of the present disclosure, as shown in FIG. 2, a film layer 10 is arranged on a light-exiting side of the optical lens 4, and it is an air layer or a layer having a low refractive index. The refractive index of the film layer 10 is smaller than that of the optical lens 4. Glassless 3D display is achieved through an array of optical lenses 4. As shown in FIG. 2, light 12 enters the optical lens 4 at a location point 11 and reaches a location point 13. At this time, the refractive indexes at two sides of an interface of a convex surface are different. Since the refractive index of the film layer 10 is smaller than that of the optical lens 4, an incident angle $\alpha$ (the angle between incident light 12 and a normal) is smaller than a refraction angle $\beta$ (the angle between the refracted light 14 and the normal).

When the film layer 10 has a low refractive index, air also exists in addition to the film layer 10. Identically, an incident angle $\beta$ (the angle between the incident light 14 and the normal) is less than a refraction angle $\gamma$ (the angle between the refracted light 16 and the normal) when the light exits the film layer 10 to air (its refractive index equals to 1). Thus, the light from the location point 11 generally travels to the right after passing through the optical lens 4.

Figure 3:
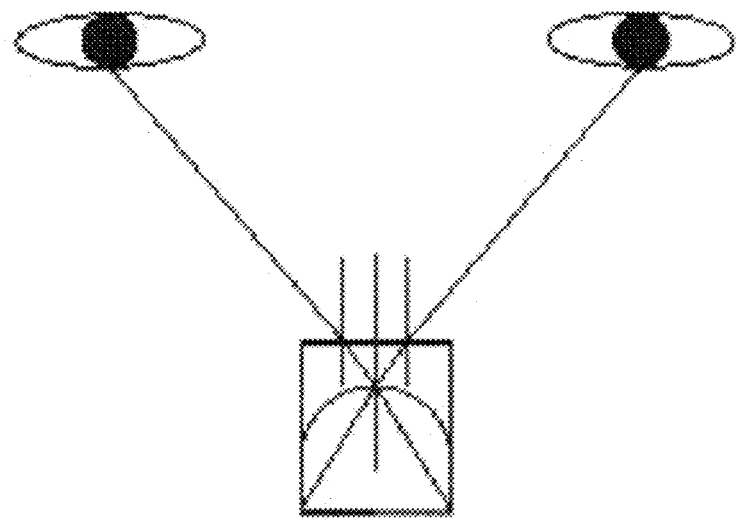

In a word, as shown in FIGS. 2 and 3, after the light from the left passes through the optical lens 4, the light travels to the right and reaches a left eye. Identically, after the light from the right passes through the optical lens 4, the light travels to the left and reaches a right eye. Hence, the left and right eyes may see a left-eye image and a right-eye image respectively, which are combined in the brain to form 3D vision.

In the embodiments of the present disclosure, the optical lens 4 is a hemispherical lens or a cylindrical lens. The hemispherical lens has a circular cross section in a first direction, and a semicircular cross section or a part of a semicircular cross section in a second direction. The cylindrical lens has a square cross section in the first direction, and a semicircular cross section or a part of a semicircular cross section in a third direction. The first direction is parallel to the substrate, the second direction is perpendicular to the substrate, and the third direction is perpendicular to the substrate and perpendicular to an extension direction of the cylindrical lens.

Figure 8:
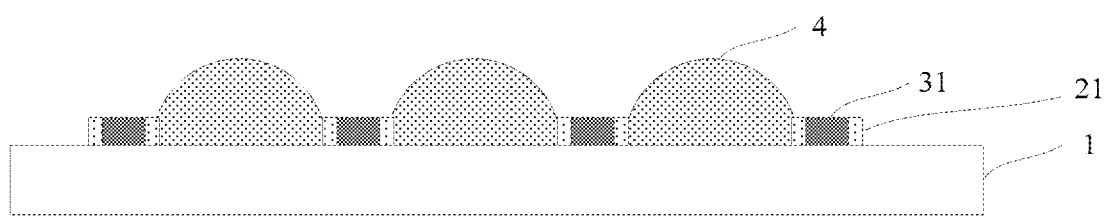

In some embodiments of the present disclosure, as shown in FIG. 8, the barrier structure is a bank 21 arranged on the substrate 1 and surrounding the black matrix 31. When the optical lens 4 is formed through heat reflux and the edge portion of the black matrix 31 is melted at the high temperature, the bank 21 may block the flow of the melted black matrix material. In this way, it is able to prevent the black matrix material from flowing to the region where the optical lens 4 is located to cover a part of the optical lens 4, thereby to prevent the light transmittance of the optical module from being deteriorated.

In order to prevent the light transmittance of the optical module from being adversely affected, the bank 21 is made of a transparent material. For example, it is made of a photoresist or a nano-imprinting adhesive. When the bank 21 is made of the photoresist, it is formed through photo-etching: and when the bank 21 is made of the nano-imprinting adhesive, it is formed through nano-imprinting. A region defined by the bank 21 matches a shape of the black matrix 31. When the black matrix 31 has a square ring shape, the region defined by the bank 21 also has a square ring shape. When the black matrix 31 has a circular ring shape, the region defined by the bank 21 also has a circular ring shape.

A thickness of the bank 21 is 1 μm to 2 μm. In order to enable the bank 21 to block the flow of the black matrix 31, the thickness of the bank 21 needs to be greater than or equal to a thickness of the black matrix 31.

Figure 9:
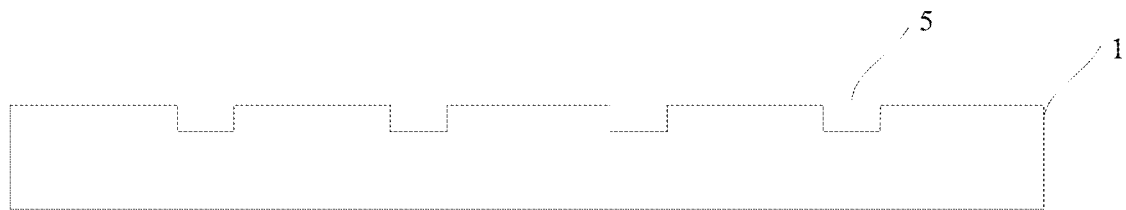
Figure 10:
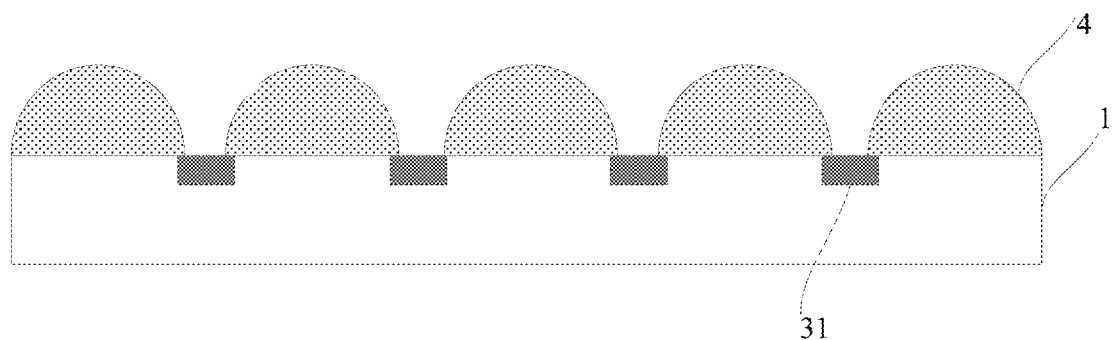

In some embodiments of the present disclosure, as shown in FIGS. 9 and 10, the barrier structure is a groove 5 penetrating through a part of the substrate 1, and the black matrix 31 is located in the groove 5. When the optical lens 4 is formed through heat reflux, the edge portion of the black matrix 31 is melted at the high temperature, and the groove 5 may block the flow of the melted black matrix material. In this way, it is able to prevent the black matrix material from flowing to the region where the optical lens 4 is located to shield a part of the optical lens 4, thereby to prevent the light transmittance of the optical module from being deteriorated.

A shape of the groove 5 is the same as that of the black matrix. When the black matrix 31 has a square ring shape, the groove 5 also has a square ring shape, and when the black matrix 31 has a circular ring shape, the groove 5 also has a circular ring shape.

In order to provide the substrate 1 with a flat surface for the subsequent formation of the optical lens 4, the thickness of the black matrix 31 is equal to a depth of the groove 5. In addition, the thickness of the black matrix 31 may also be slightly smaller than the depth of the groove, so as to enable the groove 5 to effectively block the diffusion of the edge portion of the black matrix 31 toward the optical lens 4.

Figure 11:
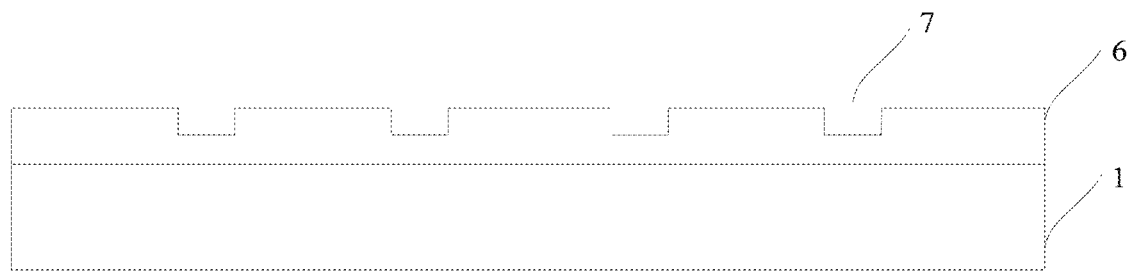
Figure 12:
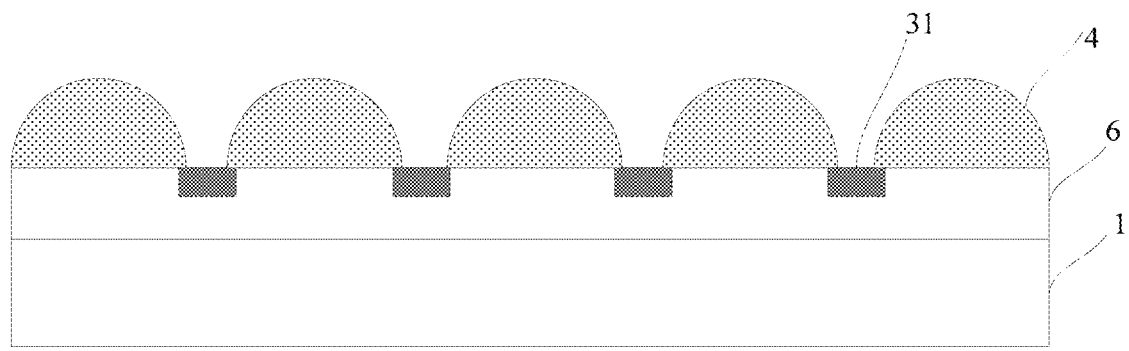

In some embodiments of the present disclosure, as shown in FIGS. 11 and 12, the optical module further includes a transparent material layer 6 arranged on a surface of the substrate 1, and the barrier structure is a groove 7 penetrating through at least a part of the transparent material layer 6. A depth of the groove 7 is less than or equal to a thickness of the transparent material layer 6, and the black matrix 31 is arranged in the groove 7. The transparent material layer 6 is made of a photoresist or a nano imprinting adhesive. When the transparent material layer 6 is made of the photoresist, the groove 7 is formed through photoetching, and when the transparent material layer 6 is made of the nano-imprinting glue, the groove 7 is formed through nano-imprinting. The transparent material layer 6 is also made of such a material as SiO or ITO, and the thickness of the transparent material layer 6 is 1 μm to 2 μm.

When the optical lens 4 is formed through heat reflux, the edge portion of the black matrix 31 is melted at the high temperature, and the groove 7 may block the flow of the melted black matrix material. In this way, it is able to prevent the black matrix material from flowing to the region where the optical lens 4 is located to cover a part of the optical lens 4, thereby to prevent the light transmittance of the optical module from being deteriorated.

A shape of the groove 7 is the same as that of the black matrix. When the black matrix 31 has a square ring shape, the groove 7 also has a square ring shape, and when the black matrix 31 has a circular ring shape, the groove 7 also has a circular ring shape.

In order to provide the transparent material layer 6 with a flat surface for the subsequent formation of the optical lens 4, the thickness of the black matrix 31 is equal to a depth of the groove 7. In addition, the thickness of the black matrix 31 may also be slightly smaller than the depth of the groove 7, so as to enable the groove 7 to effectively block the diffusion of the edge portion of the black matrix 31 toward the optical lens 4.

The present disclosure further provides in some embodiments a display device which includes the above-mentioned optical module. Through the display device, it is able to realize the glassless 3D display.

The display device includes, but not limited to, a radio frequency unit, a network module, an audio output unit, an input unit, a sensor, a display unit, a user input unit, an interface unit, a memory, a processor, and a power source. It should be appreciated that, the display device may not be limited thereto, i.e., it may include more or fewer members, or some members may be combined, or the members may be arranged in different modes. In the embodiments of the present disclosure, the display device may include, but not limited to, display, mobile phone, flat-panel computer, television, wearable electronic device or navigator.

The display device may be any product or member having a display function, such as a television, a display, a digital photo frame, a mobile phone or a tablet computer. The display device further includes a flexible circuit board, a printed circuit board, and a back plate.

In some embodiments of the present disclosure, the display device further includes a display panel arranged opposite to the optical module to form a cell, sub-pixels of the display panel correspond to the optical lenses respectively, and an orthogonal projection of a center point of each sub-pixel onto the substrate coincides with an orthogonal projection of a center point of a corresponding optical lens onto the substrate.

In the embodiments of the present disclosure, the optical module is arranged on one side of a display surface of the display panel, and includes a plurality of optical lenses 4 arranged in an array form. Each optical lens 4 corresponds to one sub-pixel, and the spacing between adjacent optical lenses is equal to a spacing between adjacent sub-pixels.

There are different distances between sub-pixels at different positions and optical centers of the corresponding optical lenses. In this way, distances between the sub-pixels at different positions and the optical module are different with respect to a focal length of the optical lens. As compared with a conventional glassless 3D display device where the distances between the sub-pixels at different positions, it is able to greatly increase a depth of a 3D image viewed by a viewer without any loss in a resolution of an image, thereby to improve a stereoscopic effect.

In the conventional glassless 3D display device, the distance g between the sub-pixel at each position and the optical center of the corresponding optical lens is equal. When displaying a 3D image, the light emitted by the sub-pixels is refracted by the optical lens and then focused to form intersection points, and a plane where these intersection points are located is called as a central depth plane a on which an image with a highest resolution is displayed.

In order to increase the image depth without any loss in the image resolution, in the embodiments of the present disclosure, the distances between the sub-pixels at different positions and the optical lenses 4 are different. In this way, the distances between the sub-pixels at different positions and the optical lens 4 are different with respect to the focal length of the optical lens 4. As compared with the conventional glassless 3D display device where the distances between the sub-pixels at different positions and the corresponding optical lenses 4 are the same, it is able to greatly increase the depth of the 3D image viewed by the viewer, thereby to improve the stereoscopic effect.

In a possible embodiment of the present disclosure, the distances g between at least a part of the sub-pixels and the optical centers of the corresponding optical lenses 4 are smaller than the focal length f of the optical lens 4, and distances g between at least the other part of the sub-pixels and the optical centers of the corresponding optical lenses 4 are larger than the focal length f of the optical lens.

Based on the above, when the distances g between a part of the sub-pixels and the optical module are less than the focal length f of the optical lens 4, the 3D image is generated at the rear of the optical module, so as to exhibit an in-screen effect. When the distances g between the other part of the sub-pixels and the optical module are greater than the focal length f of the optical lens 4, the 3D image is generated in front of the optical module, so as to exhibit an out-screen effect. In this way, it is able to greatly increase the depth of the 3D image viewed by the viewer, thereby to improve the stereoscopic effect.

It should be appreciated that, the distances g between the sub-pixels at different positions and the optical centers of the corresponding optical lenses may also be all smaller than the focal length f of the optical lens 4 or all larger than the focal length f of the optical lens 4.

In the embodiments of the present disclosure, the display panel is any display element such as Liquid Crystal Display (LCD) panel and Organic Light-Emitting Diode (OLED) display panel. The display panel is designed as a curved surface display panel, and the optical center of each optical lens 4 in the optical module is located on a same plane, so that the distances between the sub-pixels at an edge region and a central region and the optical module are different. In a possible embodiment of the present disclosure, the distances between the sub-pixels at the edge region and the optical centers of the corresponding optical lenses 4 are less than the focal length of the optical lens, and the 3D image is generated at the rear of the optical module, so as to exhibit the in-screen effect. The distances g between the sub-pixels at the central region and the optical module is greater than the focal length f of the optical lens 4, and the central depth plane where the 3D image is generated is in front of the optical lens 4, so as to exhibit the out-screen effect. In this way, it is able to greatly increase the depth of the 3D image viewed by the viewer, thereby to improve the stereoscopic effect.

In a possible embodiment of the present disclosure, for the curved surface display panel, the distances between the sub-pixels and the optical centers of the corresponding optical lenses 4 gradually decrease from the central region to the edge region.

Based on the above, since the distances between the sub-pixels and the optical module gradually change, the depth of the image viewed by the viewer gradually changes too, so as to improve a display effect.

It should be appreciated that, in some embodiments of the present disclosure, the display panel is a curved surface display panel, and the optical center of each optical lens 4 is arranged on a same plane. In the other embodiments of the present disclosure, the display panel is a curved surface display panel, and the optical centers of the optical lenses 4 are arranged on a curved surface, as long as the distances between the sub-pixels at different positions and the optical centers of the corresponding optical lenses 4 are different.

Figure 13:
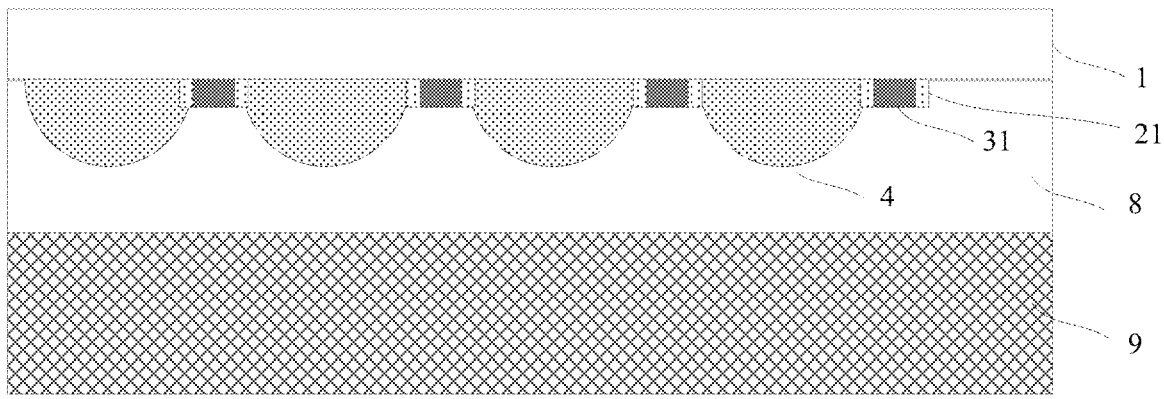
FIGS. 13 and 14 are schematic views showing a display device according to one embodiment of the present disclosure.

In some embodiments of the present disclosure, as shown in FIG. 13, the optical lenses 4 are located on a side of the substrate 1 facing the display panel 9, a layer 8 having a low refractive index is filled between the substrate 1 and the display panel 9, and a thickness of the layer 8 is greater than the thickness of the optical lens 4, so as to prevent the optical lens 4 from being in contact with the display panel 9.

Figure 14:
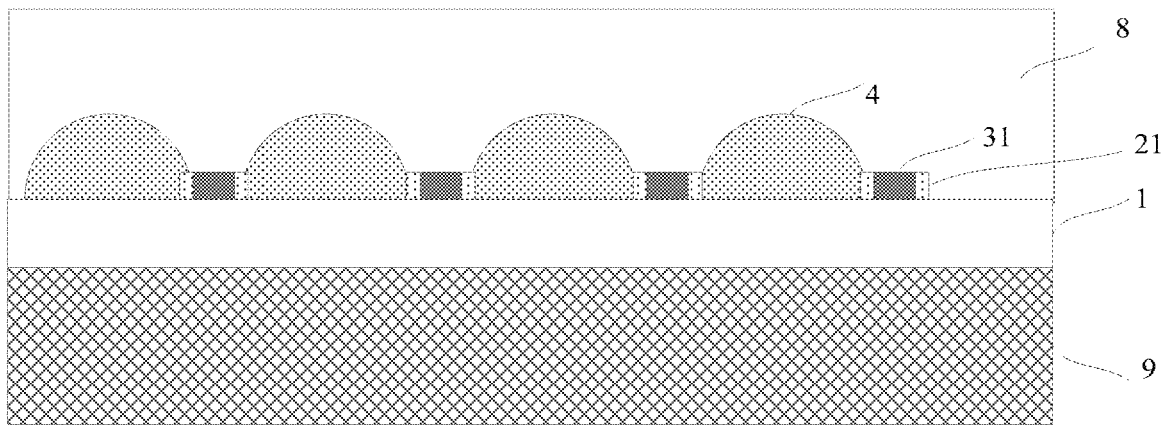

In some embodiments of the present disclosure, as shown in FIG. 14, the optical lenses 4 are also located on a side of the substrate 1 away from the display panel 9. The display device further includes a layer 8 having a low refractive index and covering the optical lenses 4. A thickness of the layer 8 is greater than the thickness of the optical lens 4, so as to protect the optical lens 4. In order to ensure a glassless 3D effect, the refractive index of the layer 8 is smaller than that of the optical lens 4 and larger than that of air.

The present disclosure further provides in some embodiments a method for manufacturing an optical module, which includes: providing a substrate; forming a barrier structure on the substrate: forming a black matrix within the barrier structure, an orthogonal projection of the black matrix onto the substrate not going beyond a region surrounded by the barrier structure; and forming optical lenses through heat reflux. An orthogonal projection of a gap between adjacent optical lenses onto the substrate falls within the black matrix.

In the embodiments of the present disclosure, the barrier structure is arranged on the substrate, and the black matrix is located within the region defined by the barrier structure. In this regard, even if an edge portion of the black matrix is melted at a high temperature when the optical lenses are formed through heat reflux, the barrier structure may block the flow of a melted black matrix material, so as to prevent the black matrix material from flowing to a region where the optical lenses are located, thereby to prevent a light transmittance of the optical module from being deteriorated.

In some embodiments of the present disclosure, as shown in FIGS. 4-8, the method includes the following steps.

Figure 4:
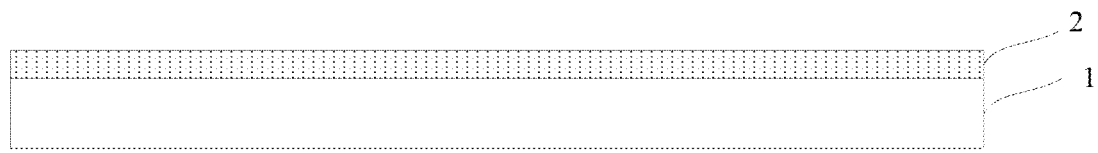
FIGS. 4-12 are schematic views showing the manufacture of an optical module according to one embodiment of the present disclosure.

Step 1: as shown in FIG. 4, the substrate 1 is provided, and the transparent material layer 2 is formed on the substrate 1.

The substrate 1 is a rigid substrate such as a quartz substrate or a glass substrate, or a flexible substrate. The transparent material layer 2 is made of silicon oxide or silicon nitride, or a photoresist or a nano-imprinting adhesive. When the transparent material layer 2 is made of silicon oxide or silicon nitride, it is formed through deposition, and when the transparent material layer 2 is made of the photoresist or the nano-imprinting adhesive, it is formed through coating. A thickness of the transparent material layer 2 is 1 μm to 2 μm.

Figure 5:
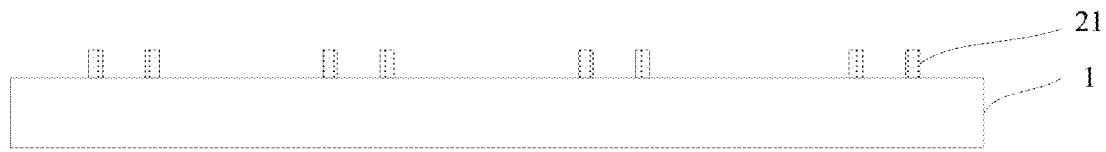

Step 2: as shown in FIG. 5, the bank 21 is formed through the transparent material layer 2.

When the transparent material layer 2 is made of the photoresist, the bank 21 is formed through photoetching, and when the transparent material layer 2 is made of the nano-imprinting adhesive, the bank 21 is formed through nano-imprinting. A region defined by the bank 21 matches a shape of the black matrix 31. When the black matrix 31 has a square ring shape, the region defined by the bank 21 also has a square ring shape. When the black matrix 31 has a circular ring shape, the region defined by the bank 21 also has a circular ring shape.

Figure 6:
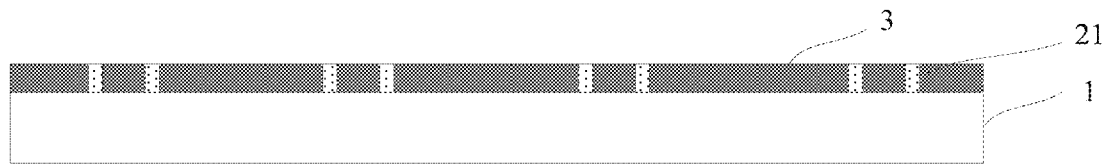

Step 3: as shown in FIG. 6, the black matrix material layer 3 is formed on the substrate 1.

Specifically, the black matrix material layer 3 is coated onto the substrate 1.

Figure 7:
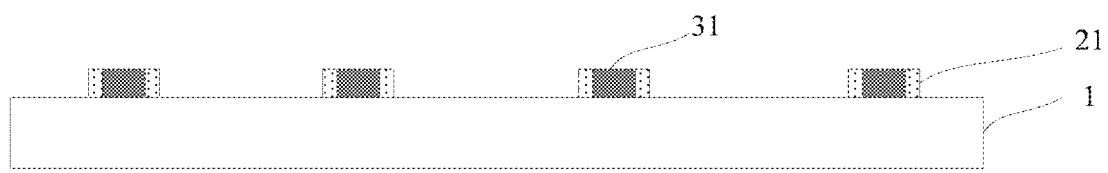

Step 4: as shown in FIG. 7, the black matrix material layer 3 is exposed, and the black matrix material layer 3 outside the region defined by the bank 21 is removed through development to form the black matrix 31.

Step 5: as shown in FIG. 8, optical lenses 4 are formed through heat reflux, and a gap between adjacent optical lenses 4 is filled by the bank 21 and the black matrix 31.

In the embodiments of the present disclosure, the bank 21 surrounds the black matrix 31, and when the optical lenses 4 are formed through heat reflux, the edge portion of the black matrix 31 is melted at a high temperature, and the bank 21 may block the flow of the melted black matrix material. In this way, it is able to prevent the black matrix material from flowing to the region where the optical lenses 4 are located, thereby to prevent the light transmittance of the optical module from being deteriorated.

In order to block the flow of the black matrix 31 through the bank 21, a thickness of the bank 21 needs to be greater than or equal to the thickness of the black matrix 31.

In the embodiments of the present disclosure, it should be appreciated that, a melting point of the bank 21 should be greater than a melting point of the black matrix 31 and a melting point of the optical lens 4. In this way, it is able to prevent the bank 21 from being adversely affected, e.g., melted, when the optical lenses 4 are formed through heat reflux.

In some embodiments of the present disclosure, as shown in FIGS. 9-10, the method includes the following steps.

Step 1: as shown in FIG. 9, the substrate 1 is provided, and a surface of the substrate 1 is etched to form the groove 5 penetrating through a part of the substrate 1.

The substrate 1 is a rigid substrate such as a quartz substrate or a glass substrate, or a flexible substrate.

At first, a photoresist is applied onto the substrate 1, a photoresist pattern is formed through photoetching, and the substrate 1 is etched with the photoresist pattern as a mask to form the groove 5 for receiving the black matrix 31. Alternatively, a nano-imprinting adhesive is applied onto the substrate 1, a nano-imprinting adhesive pattern is formed through nano-imprinting, and the substrate is etched with the nano-imprinting adhesive pattern as a mask to form the groove 5 for receiving the black matrix 31.

Step 2: as shown in FIG. 10, the black matrix 31 and the optical lenses 4 are formed.

Specifically, a black matrix material layer is applied onto the substrate 1, and then exposed. The black matrix material layer 3 outside the groove 5 is removed through development, so as to form the black matrix 31.

Next, the optical lenses 4 are formed through heat reflux, and an orthogonal projection of a gap between adjacent optical lenses 4 onto the substrate 1 falls within the black matrix 31.

In the embodiments of the present disclosure, when the optical lenses 4 are formed through heat reflux, the edge portion of the black matrix 31 is melted at a high temperature, and the groove 5 may block the flow of the melted black matrix material. In this way, it is able to prevent the black matrix material from flowing to the region where the optical lens 4 are located to cover a part of the optical lens 4, thereby to prevent the light transmittance of the optical module from being deteriorated.

A shape of the groove 5 is the same as that of the black matrix. When the black matrix 31 has a square ring shape, the groove 5 also has a square ring shape, and when the black matrix 31 has a circular ring shape, the groove 5 also has a circular ring shape.

In order to provide the substrate 1 with a flat surface for the subsequent formation of the optical lens 4, the thickness of the black matrix 31 is equal to a depth of the groove 5. In addition, the thickness of the black matrix 31 may also be slightly smaller than the depth of the groove, so as to enable the groove 5 to effectively block the diffusion of the edge portion of the black matrix 31 toward the optical lens 4.

In some embodiments of the present disclosure, as shown in FIGS. 11 and 12, the method includes the following steps.

Step 1: as shown in FIG. 11, the substrate 1 is provided, the transparent material layer 6 is formed on the substrate 1, and a surface of the transparent material layer 6 is etched to form the groove 7 penetrating through at least a part of the transparent material layer 6 as the barrier structure.

The substrate 1 is a rigid substrate such as a quartz substrate or a glass substrate, or a flexible substrate.

The transparent material layer 6 is made of a photoresist or a nano imprinting adhesive. When the transparent material layer 6 is made of the photoresist, the groove 7 is formed through photoetching, and when the transparent material layer 6 is made of the nano-imprinting glue, the groove 7 is formed through nano-imprinting. The transparent material layer 6 is also made of such a material as SiO or ITO, and the thickness of the transparent material layer 6 is 1 μm to 2 μm.

When the transparent material layer 6 is made of a material such as SiO or ITO, the photoresist is applied onto the transparent material layer 6, a photoresist pattern is formed through photoetching, and the transparent material layer 6 is etched with the photoresist pattern as a mask to form the groove 7 for receiving the black matrix 31. Alternatively, the nano-imprinting adhesive is applied onto the transparent material layer 6, a nano-imprinting adhesive pattern is formed through imprinting, and the transparent material layer 6 is etched with the nano-imprinting adhesive pattern as a mask to form the groove 7 for receiving the black matrix 31.

Step 2: as shown in FIG. 12, the black matrix 31 and the optical lenses 4 are formed.

Specifically, a black matrix material layer is applied onto the substrate 1, and then exposed. The black matrix material layer 3 outside the groove 7 is removed through development, so as to form the black matrix 31.

The optical lenses 4 are formed through heat reflux, and an orthogonal projection of a gap between adjacent optical lenses 4 onto the substrate 1 falls within the black matrix 31.

In the embodiments of the present disclosure, when the optical lenses 4 are formed through heat reflux, the edge portion of the black matrix 31 is melted at a high temperature, and the groove 7 may block the flow of the melted black matrix material. In this way, it is able to prevent the black matrix material from flowing to the region where the optical lens 4 are located to cover a part of the optical lens 4, thereby to prevent the light transmittance of the optical module from being deteriorated.

A shape of the groove 7 is the same as that of the black matrix. When the black matrix 31 has a square ring shape, the groove 7 also has a square ring shape, and when the black matrix 31 has a circular ring shape, the groove 7 also has a circular ring shape.

In order to provide the transparent material layer 6 with a flat surface for the subsequent formation of the optical lens 4, the thickness of the black matrix 31 is equal to a depth of the groove 7. In addition, the thickness of the black matrix 31 may also be slightly smaller than the depth of the groove 7, so as to prevent the optical lens from being adversely affected by the black matrix in a heat reflux process.

In the embodiments of the present disclosure, it should be appreciated that, a melting point of the transparent material layer 6 should be greater than a melting point of the black matrix 31 and a melting point of the optical lens 4. In this way, it is able to prevent the transparent material layer 6 from being adversely affected, e.g., melted, when the optical lenses 4 are formed through heat reflux.

It should be appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An optical module, comprising:
   a substrate;
   a barrier structure arranged on the substrate; a black matrix arranged within the barrier structure, an orthogonal projection of the black matrix onto the substrate not going beyond a region surrounded by the barrier structure; and
   optical lenses arranged on a side of the black matrix away from the substrate,
   wherein an orthogonal projection of a gap between adjacent optical lenses onto the substrate falls into the black matrix;
   wherein an orthogonal projection of the black matrix onto the barrier structure does not go beyond a region surrounded by the barrier structure.

2. The optical module of claim 1, wherein the barrier structure is a bank arranged on the substrate and surrounding the black matrix.

3. The optical module according to claim 2, wherein a thickness of the bank is greater than or equal to a thickness of the black matrix.

4. The optical module according to claim 1, wherein the barrier structure is a groove penetrating through a part of the substrate, and the black matrix is located within the groove.

5. The optical module according to claim 1, wherein the optical module further comprises a transparent material layer arranged on a surface of the substrate, and the barrier structure is a groove penetrating through at least a part of the transparent material layer.

6. The optical module according to claim 4, wherein a thickness of the black matrix is less than or equal to a depth of the groove.

7. A display device, comprising the optical module according to claim 1.

8. The display device according to claim 7, further comprising a display panel arranged opposite to the optical module to form a cell, wherein sub-pixels of the display panel correspond to the optical lenses respectively, and an orthogonal projection of a center point of each sub-pixel onto the substrate coincides with an orthogonal projection of a center point of a corresponding optical lens onto the substrate.

9. The display device according to claim 7, wherein the optical lenses are arranged on a side of the substrate away from the display panel.

10. The display device according to claim 7, wherein the optical lenses are arranged on a side of the substrate facing the display panel, a layer having a low refractive index is filled between the substrate and the display panel, a thickness of the layer is greater than a thickness of the optical lens, and the refractive index of the layer is less than a refractive index of the optical lens.

11. The optical module according to claim 4, wherein a thickness of the black matrix is less than or equal to a depth of the groove.

12. A method for manufacturing an optical module, comprising:
    providing a substrate;
    forming a barrier structure on the substrate;
    forming a black matrix within the barrier structure, an orthogonal projection of the black matrix onto the substrate not going beyond a region surrounded by the barrier structure; and
    forming optical lenses through heat reflux,
    wherein an orthogonal projection of a gap between adjacent optical lenses onto the substrate falls within the black matrix;
    wherein an orthogonal projection of the black matrix onto the barrier structure does not go beyond a region surrounded by the barrier structure.

13. The method according to claim 12, wherein the forming the barrier structure comprises:
    forming a transparent material layer on the substrate; and
    forming a bank using the transparent material layer through imprinting or photoetching to surround the black matrix.

14. The method according to claim 12, wherein the barrier structure is a groove penetrating through a part of the substrate, and the forming the barrier structure comprises etching a surface of the substrate to form the groove penetrating through a part of the substrate.

15. The method according to claim 12, wherein the forming the barrier structure comprises:
    forming a transparent material layer on the substrate; and
    etching the transparent material layer to form a groove penetrating through at least a part of the transparent material layer as the barrier structure.

* * * * *